(12) United States Patent
Ku et al.

(10) Patent No.: US 7,570,088 B1
(45) Date of Patent: Aug. 4, 2009

(54) INPUT/OUTPUT BUFFER FOR WIDE SUPPLY VOLTAGE RANGE

(75) Inventors: Ting-Sheng Ku, San Jose, CA (US); Chang Hee Hong, Pleasanton, CA (US); Ashfaq R. Shaikh, San Jose, CA (US); Shifeng Yu, Fremont, CA (US)

(73) Assignee: nVidia Corporation, Santa Clara, CA (US)

( * ) Notice: Subject to any disclaimer, the term of this patent is extended or adjusted under 35 U.S.C. 154(b) by 101 days.

(21) Appl. No.: 11/293,627

(22) Filed: Dec. 1, 2005

(51) Int. Cl.
*H03K 3/00* (2006.01)
(52) U.S. Cl. .............................. 327/112; 326/81; 326/87

(58) Field of Classification Search ......... 327/530–543, 327/170, 108, 436, 437, 309, 328, 389; 323/282–284, 323/315, 316; 324/71, 81, 121, 24, 27, 34; 326/56, 68, 82, 83, 86, 87, 112, 113
See application file for complete search history.

(56) References Cited

U.S. PATENT DOCUMENTS

| | | | | |
|---|---|---|---|---|
| 5,640,122 | A | * | 6/1997 | McClure ..................... 327/530 |
| 6,724,222 | B2 | * | 4/2004 | Patel et al. ..................... 326/80 |

* cited by examiner

*Primary Examiner*—Rajnikant B Patel
(74) *Attorney, Agent, or Firm*—Berkeley Law & Technology Group, LLP

(57) ABSTRACT

Embodiments for providing a plurality of bias voltages to input/output circuitry are disclosed.

22 Claims, 6 Drawing Sheets

INPUT/OUTPUT BUFFER FOR WIDE SUPPLY VOLTAGE RANGE

BACKGROUND

This disclosure is related to integrated circuit input/output buffers.

In an effort to improve integrated circuit performance and/or to reduce power consumption, the internal operating voltages of various integrated circuits continue to decrease. Often, thin-oxide transistors are used in integrated circuits to provide increased performance at lower voltages. However, it is often the case where integrated circuits using thin-oxide transistors operate in environments where relatively high power supply voltages are present and/or where relatively large voltage swings are present at input/output pads. In such situations, the voltages that can be tolerated by the transistors may be exceeded, resulting in oxide overstress conditions that may in turn lead to unreliable operation and/or device failure.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description if read with the accompanying drawings in which:

DETAILED DESCRIPTION

Figure 1:
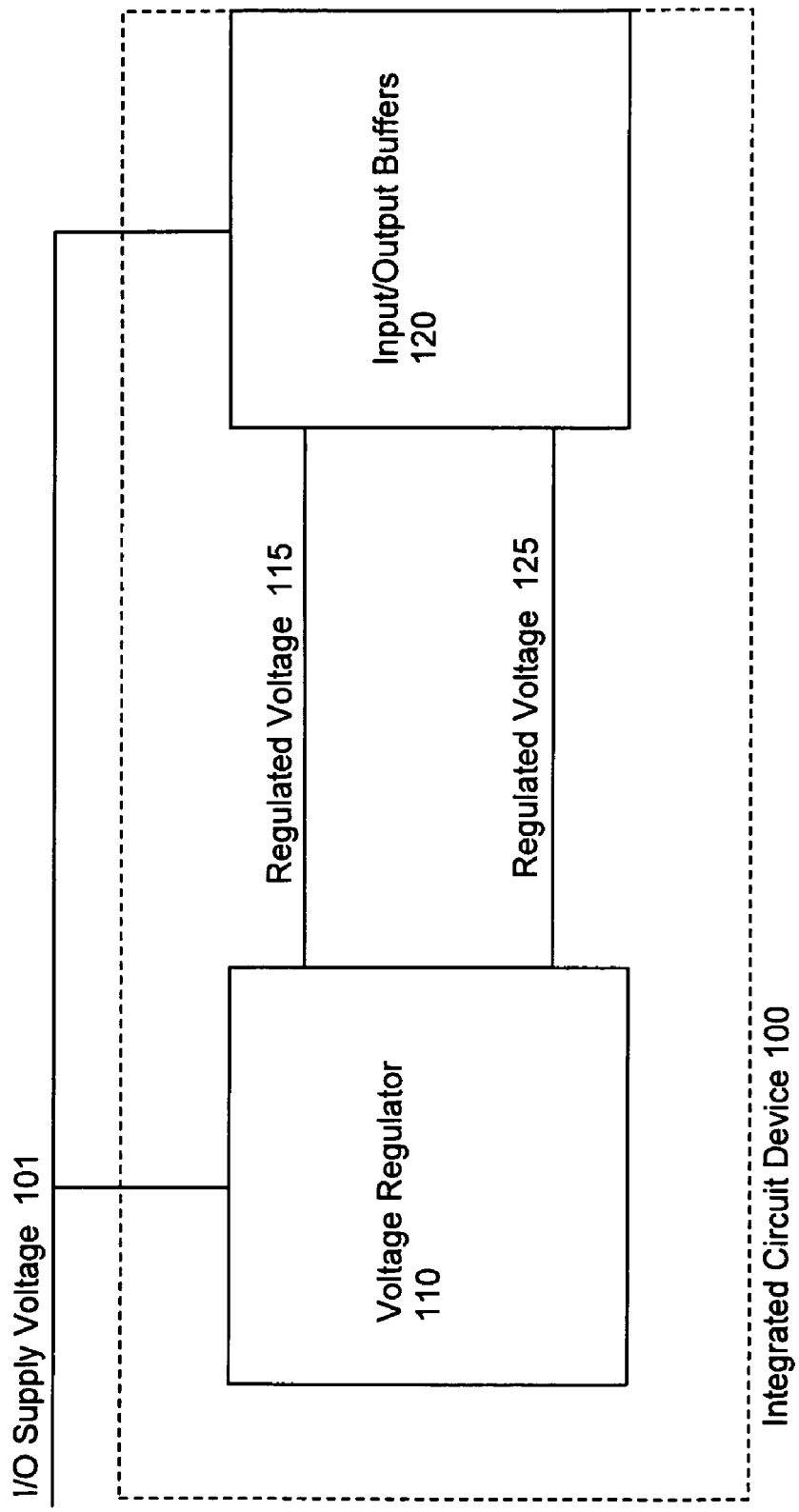
FIG. 1 is a block diagram of an example embodiment of an integrated circuit device comprising an example voltage regulator and example input/output buffers.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

"Logic" as referred to herein relates to structure for performing one or more logical operations. For example, logic may comprise circuitry which provides one or more output signals based at least in part on one or more input signals. Such circuitry may comprise a finite state machine which receives a digital input signal and provides a digital output signal, or circuitry which provides one or more analog output signals in response to one or more analog input signals. Such circuitry may be provided, for example, in an application specific integrated circuit (ASIC) and/or a field programmable gate array (FPGA). Also, logic may comprise machine-readable instructions stored in a storage medium in combination with a processor or other processing circuitry to execute such machine-readable instructions. However, these are merely examples of structures which may provide logic and claimed subject matter is not limited in these respects.

Unless specifically stated otherwise, as apparent from the following discussion, it is appreciated that throughout this specification discussions utilizing terms such as "processing," "computing," "calculating," "selecting," "forming," "enabling," "inhibiting," "identifying," "initiating," "querying," "obtaining," "hosting," "maintaining," "representing," "modifying," "receiving," "transmitting," "storing," "determining" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing platform refers to a system or a device that includes the ability to process and/or store data in the form of signals. Thus, a computing platform, in this context, may comprise hardware, software, firmware and/or any combination thereof. Further, unless specifically stated otherwise, a process as described herein, with reference to flow diagrams or otherwise, may also be executed and/or controlled, in whole or in part, by a computing platform.

FIG. 1 is a block diagram of an example embodiment of an integrated circuit device 100 comprising an example voltage regulator 110 and example input/output buffers 120. For this example, an I/O supply voltage 101 is applied to voltage regulator 110 and input/output buffers 120. I/O supply voltage for this example may exceed the tolerance voltage of devices and/or components and/or circuitry within input/output buffers 120. In order to extend the maximum allowable I/O supply voltage, voltage regulator 110 generates two regulated voltage signals 115 and 125 to input/output buffers 120. Regulated voltages 115 and 125 provide bias voltages to input/output buffers 120, thereby increasing the maximum I/O supply voltage that can be tolerated by the input/output buffer circuitry.

For this example embodiment, voltage regulator 110 is located on the same integrated circuit die as the input/output buffer circuitry, although other embodiments are possible where the voltage regulator is not located on the same integrated circuit die as the input/output buffer circuitry. Locating the voltage regulator on the same die as the input/output buffer circuitry may provide a benefit of not needing additional inputs for integrated circuit device 100 to receive the regulated voltage levels from an external voltage regulator.

Voltage regulator 110 may for this example embodiment provide two regulated voltages to a wide number of input and/or output and/or input/output buffer circuits. The two regulated voltage levels may be programmed independently one from another so that the maximum noise margin and/or the minimum propagation delay and/or the minimum amount of ripples on the regulated outputs can be achieved. However, the scope of the claimed subject matter is not limited in these respects.

Figure 2:
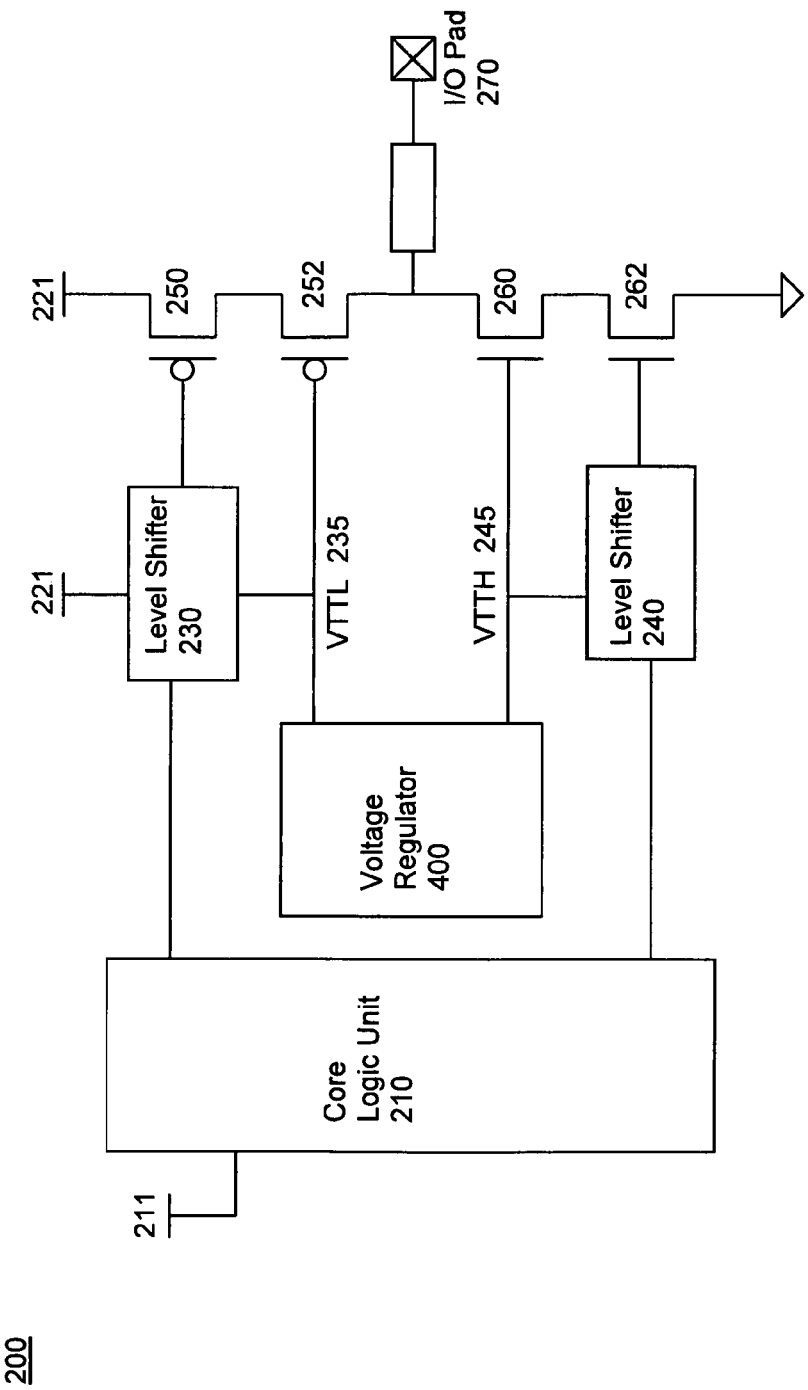
FIG. 2 is a block diagram of an example embodiment of an integrated circuit device comprising an example voltage regulator coupled to example output buffer circuitry.

FIG. 2 is a block diagram of an example embodiment of an integrated circuit device 200 comprising an example voltage regulator 400 coupled to example output buffer circuitry. For this example embodiment, the example output buffer circuitry includes PMOS transistors 250 and 252 and NMOS transistors 260 and 262. Although the embodiments described herein utilize NMOS and PMOS transistors for input/output buffer circuitry, other embodiments are possible using other voltage-controlled switching devices, including other types of transistors. For the embodiments described herein, the buffer transistors may comprise thin-oxide transistors.

Integrated circuit device 200 for this example further includes a core logic unit 210. Core logic unit 210 may implement any of a wide range of functions. For this example embodiment, core logic unit 210 operates at a relatively low voltage supplied by supply voltage input 211. A relatively high supply voltage may be supplied to integrated circuit device 200 via supply voltage inputs 221. For this example, the relatively low supply voltage level supplied to input 211 may have a level in the range of approximately 0.9-1.3 volts, although the scope of the claimed subject matter is not limited in this respect. This relatively low supply voltage may be generated by a voltage divider or other circuitry within integrated circuit device 200, although again the scope of the claimed subject matter is not limited in this respect. Also for this example, the relatively high supply voltage may have a level in the range of approximately 1.3-2.6 volts, although the scope of the claimed subject matter is not limited in this respect. Voltage regulator 400 may be programmed to operate in one of a number of modes depending on the level of the relatively high supply voltage applied to supply voltage inputs 221. Example operating modes are discussed more fully below in connection with FIG. 4.

Voltage regulator 400 for this example embodiment may generate a regulated bias voltage (VTTL) 235 and delivers this voltage to a level shifter 230 and to PMOS transistor 252. VTTL bias voltage 235 applied to transistor 252 may serve to ensure that the voltage drops across transistors 250 and 252 do not exceed what can be tolerated by the transistors, thereby avoiding oxide overstress conditions. For example, if transistor 250 has a voltage tolerance of 1.3 volts, and if 2.6 volts is applied to supply voltage input 221, a voltage of 1.3 volts on VTTL 235 will limit the source-to-drain voltage for transistor 250 to 1.3 volts. Similarly, voltage regulator 400 for this example embodiment may generate a regulated bias voltage (VTTH) 245 and may deliver this voltage to a level shifter 240 and to NMOS transistor 260. VTTH bias voltage 245 applied to transistor 260 may serve to ensure that the voltage drops across transistors 260 and 262 do not exceed what can be tolerated by the transistors. For this example embodiment, level shifters 230 and 240 serve to couple control signals in the core logic domain to the input/output buffer domain.

Figure 3:
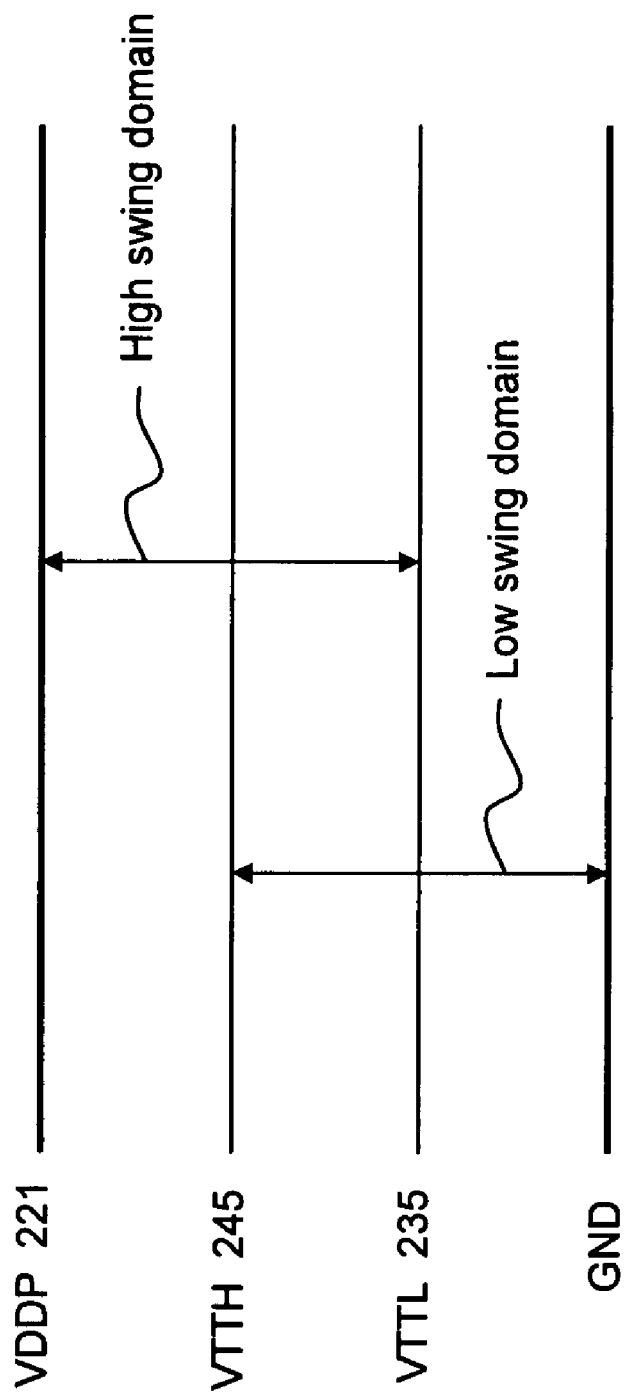
FIG. 3 is a diagram depicting example voltage domains based at least in part on bias voltages generated by an example embodiment of a voltage regulator.

FIG. 3 is a diagram depicting example voltage domains based at least in part on bias voltages generated by an example embodiment of a voltage regulator. The bias voltages for this example correspond to VTTH 245 and VTTL 235 regulated bias voltages described above in connection with FIG. 2. FIG. 3 demonstrates that the two bias voltages VTTH 245 and VTTL 235 may be separately programmed for different voltage levels. For this example embodiment, VTTH 245 may be set to a voltage between the supply voltage (VDDP) 221 and a value of VDDP/2. Also for this example, VTTL 235 may be set to a voltage between VDDP/2 and GND. The high swing domain for this example represents the range of voltages that may be applied to the pull-up path of integrated circuit device 200, and the low swing domain for this example represents the range of voltages that may be applied to the pull-down path of integrated circuit device 200. However, these are merely example voltage levels and ranges, and the scope of the claimed subject matter is not limited in these respects.

Figure 4:
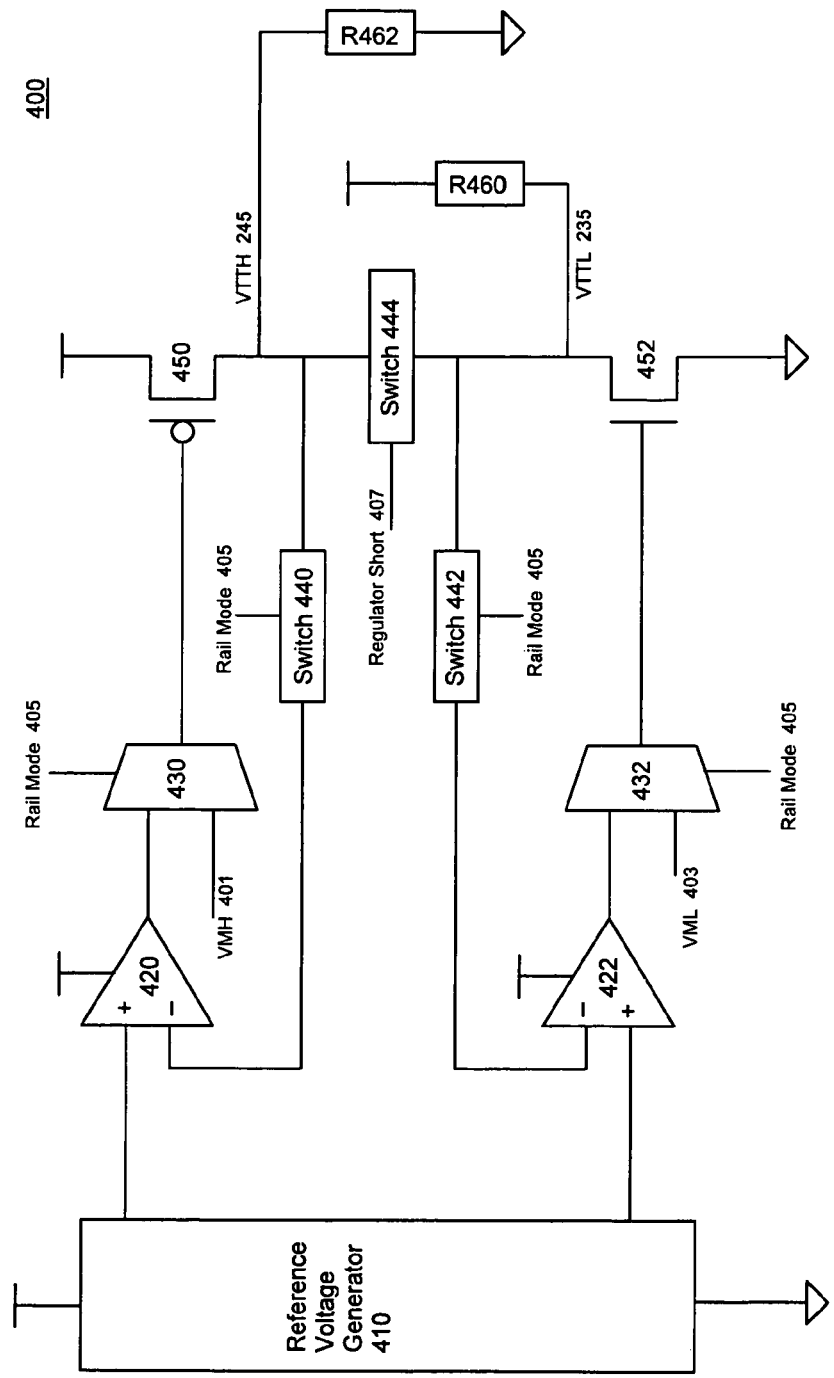
FIG. 4 is a block diagram of an example embodiment of a voltage regulator.

FIG. 4 is a block diagram of an example embodiment of a voltage regulator 400. Voltage regulator 400 for this example may correspond to the voltage regulator discussed above in connection with FIG. 2. Voltage regulator 400 may include a reference voltage generator 410. Reference voltage generator 410 may be programmable, and may generate one or more reference voltages. For this example embodiment, reference voltage generator 410 may generate two reference voltages, although the scope of the claimed subject matter is not limited in this respect. The reference voltages may be generated by dividing a supply voltage. For this embodiment, one reference voltage is delivered to a difference amplifier 420 and another reference voltage is delivered to a difference amplifier 422. The outputs of amplifiers 420 and 422 are coupled to multiplexer (MUX) 430 and MUX 432, respectively. The output of MUX 430 is coupled to the gate of PMOS transistor 450 and the output of MUX 432 is coupled to the gate of NMOS transistor 452. Resistor 462 provides a pull-down for the VTTH node 245 and resistor 460 provides a pull-up for VTTL node 235.

Voltage regulator 400 for this example embodiment may be capable of operating in any of several operating modes, although the scope of the claimed subject matter is not limited in this respect. The various operating modes may be determined by the states of control signals Rail Mode 405, Regulator Short 407, VML 403, and VMH 401. A first operating mode may be used for situations where the supply voltage VDDP is approximately between 1.3 and 2 times the voltage tolerance of the buffer transistors. Regulator Short signal 407 may be asserted causing switch 444 to close, thereby shorting together VTTL 235 and VTTH 245. In this case, VTTL and VTTH may be programmed to have a value that is half that of the supply voltage. Shorting the regulator outputs may have an advantage of effectively doubling the decoupling capacitance on the regulator outputs. In this mode, Rail Mode signal 405 is not asserted. For this example embodiment, switches 440 and 442 are closed when Rail Mode 405 is not asserted. Also, in response to Rail Mode 405 not being asserted, MUX 430 and MUX 432 select the outputs of the amplifiers 420 and 422 to output to transistors 450 and 452, respectively. Also in this mode, VMH 401 may be set to a value of VDDP/2. VML 403 may also be set to VDDP/2. These are merely examples of values for control signals VMH 401 and VML 403, and the scope of the claimed subject matter is not limited in these respects.

A second operating mode may be used for situations where the supply voltage VDDP is approximately between 1.0 and 1.3 times the voltage tolerance of the buffer transistors. VTTL and VTTH are separated (that is, switch 444 is open). In this mode, the voltage level on VTTH 245 may be raised and the voltage level on VTTL 235 may be lowered so that the supply level to the buffer circuitry may be maximized without causing voltage overstress. In this mode for this example, the VTTH level may be as high as 0.75 times VDDP and the VTTL level may be as low as 0.25 times VDDP. In this mode, improvements in noise margin may be realized and overall propagation delay may be reduced. As previously described, the VTTH and VTTL levels may be independently programmed. In this mode, Rail Mode 405 is not asserted, and switches 440 and 442 are closed. Also, in response to Rail Mode 405 not being asserted, MUX 430 and MUX 432 select the outputs of the amplifiers 420 and 422 to output to transistors 450 and 452, respectively. VMH 401 and VML 403 may be set to VDDP/2. For this mode, Regulator Short 407 is not asserted, and switch 444 is open.

A third operating mode may be used for situations where the supply voltage VDDP is approximately equal to or lower than the voltage tolerance of the buffer transistors. In this mode, Rail Mode 405 is asserted, and switches 440 and 442 are open, thereby disabling the feedback paths to amplifiers 420 and 422. In response to the assertion of Rail Mode 405, MUX 430 delivers VMH 401 to the gate of transistor 450. For this mode, VMH 401 may be set to GND. Also in response to the assertion of Rail Mode 405, MUX 432 selects VML 403 to output to the gate of transistor 452. For this mode, VML may be set to VDDP. For this mode, Regulator Short 407 is not asserted, and switch 444 is open.

As can be seen by the discussion above in connection with the various example operating modes, the embodiments described herein provide for the use of high speed, low voltage, thin-oxide transistors in environments where a wide range of supply voltages may be used.

Although the integrated circuit 200 is depicted with a particular configuration of devices and/or components, other embodiments are possible using any of a wide range of configurations of devices and/or components. Similarly, although voltage regulator 400 is described with a particular configuration of devices and/or components, other embodiments are possible using any of a wide range of configurations of devices and/or components. Further, the operating modes and supply voltage ranges described in connection with FIG. 4 are merely examples, and the scope of the claimed subject matter is not limited in these respects.

Figure 5:
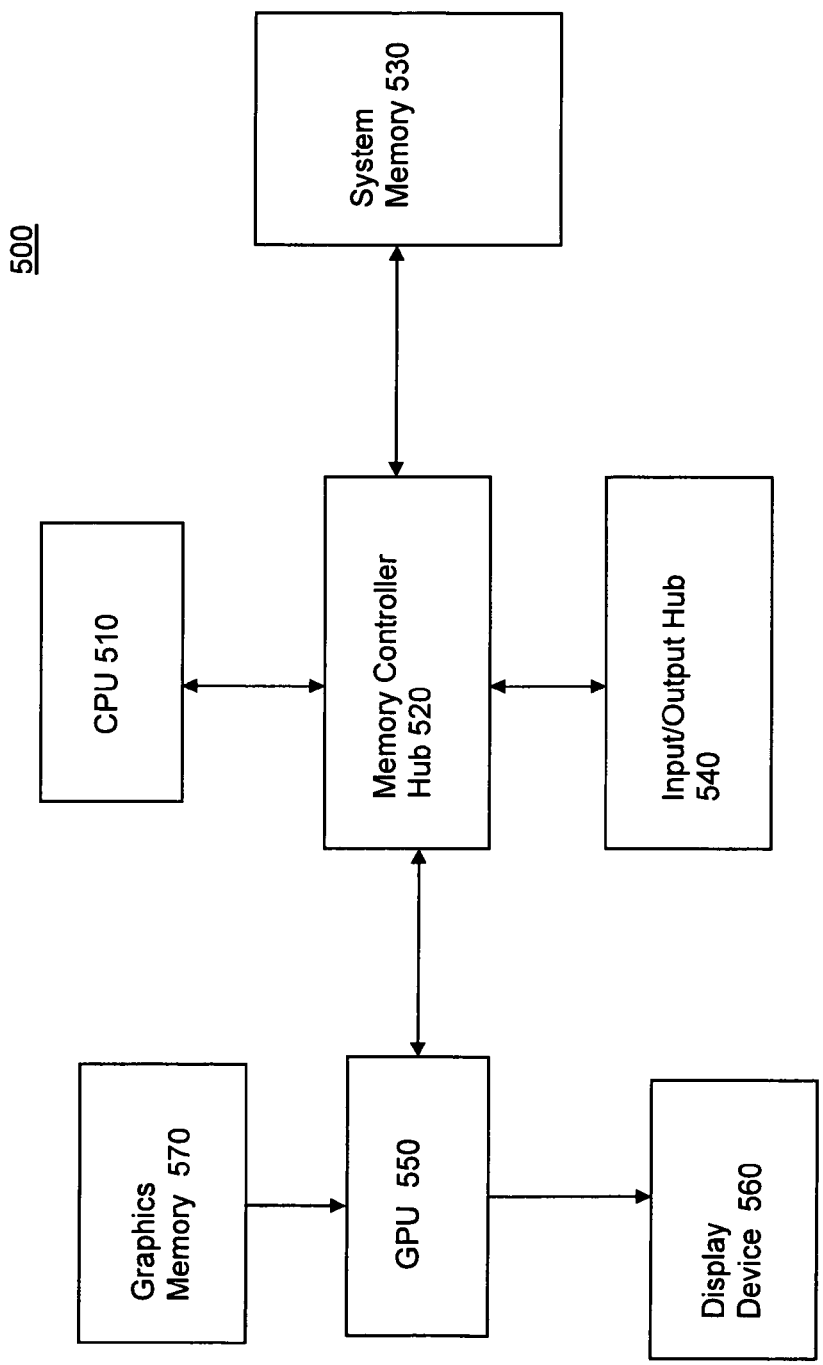
FIG. 5 is a block diagram of an example embodiment of a computing platform.

FIG. 5 is a block diagram of an example embodiment of a computing platform 500. Computing platform 500 includes a CPU 510 and a memory controller hub 520 coupled to CPU 510. Memory controller hub 520 is further coupled to a system memory 530, to a GPU 550, and to an input/output hub 540. GPU 550 is further coupled to a display device 560, which may comprise a CRT display, a flat panel LCD display, or other type of display device. Also coupled to GPU 550 is a graphics memory 570. For this example embodiment, graphics memory 570 may be coupled to GPU 550 via a double data rate (DDR) interface. GPU 550 may comprise circuitry similar to that discussed above in connection with FIGS. 1-4, although the scope of the claimed subject matter is not limited in this respect. Any or all of the other components of example platform 500 may comprise circuitry similar to that discussed above in connection with FIGS. 1-4.

Although example system 500 is shown with a particular configuration of components, other embodiments are possible using any of a wide range of configurations. Further, the example embodiments described herein may be utilized in any of a wide range of electronic devices, including, but not limited to, computing platforms, gaming devices, cellular phones, personal digital assistants, music players, communications network components, etc.

Figure 6:
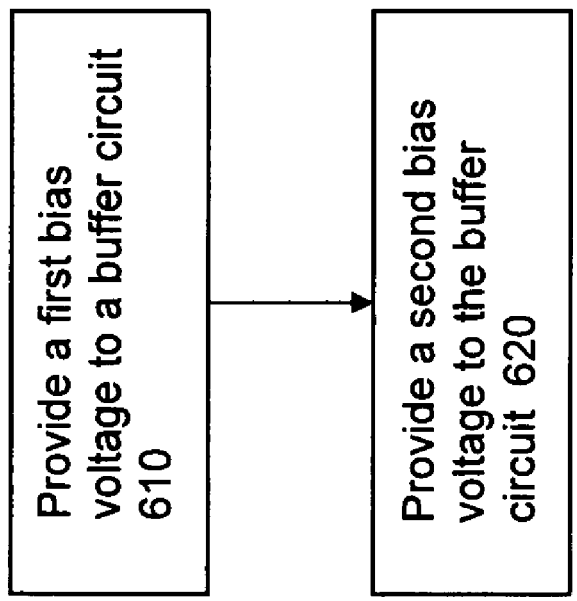
FIG. 6 is a flow diagram of an example embodiment of a method for providing a plurality of bias voltages to input/output buffer circuitry.

FIG. 6 is a flow diagram of an example embodiment of a method for providing a plurality of bias voltages to input/output buffer circuitry. At block 610, a first bias voltage is provided to a buffer circuit. At block 620, a second bias voltage is provided to the buffer circuit. The bias voltages and/or buffer circuits may be similar in one embodiment to the voltages and/or buffer circuitry discussed above in connection with FIGS. 1-4, although the scope of the claimed subject matter is not limited in these respects. An embodiment in accordance with claimed subject matter may include all, more than all or less than all of blocks 610-620. Furthermore, the order of blocks 610-620 is merely an example order, and the scope of the claimed subject matter is not limited in this respect.

In the preceding description, various aspects of claimed subject matter have been described. For purposes of explanation, systems and configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. An apparatus, comprising:
 a buffer circuit comprising
  a pull-down path comprising first and second transistors coupled in series between an output signal terminal and a ground voltage connection, a gate of the first transistor to receive a first bias voltage and a gate of the second transistor to receive a first level-shifted data signal having a voltage level based at least in part on the first bias voltage.

2. The apparatus of claim 1, wherein the buffer circuit further comprises a pull-up path comprising third and fourth transistors coupled in series between a supply voltage connection and the output signal terminal, a gate of the third transistor to receive a second bias voltage and a gate of the fourth transistor to receive a second level-shifted data signal having a voltage level based at least in part on the second bias voltage.

3. The apparatus of claim 2, further comprising a first level shifter to receive a first data signal from a logic unit and to receive the first bias voltage, the first level shifter further to transmit the first level-shifted data signal to the second transistor.

4. The apparatus of claim 3, further comprising a second level shifter to receive a second data signal from the logic unit and to receive the second bias voltage, the second level shifter further to transmit the second level-shifted data signal to the fourth transistor.

5. The apparatus of claim 4, further comprising a voltage regulator to generate the first and second bias voltages based at least in part on one or more reference voltages generated by a reference voltage generator.

6. The apparatus of claim 5, wherein the reference voltage generator is programmable.

7. The apparatus of claim 6, wherein the reference voltage generator is adapted to generate a first programmable reference voltage and a second programmable reference voltage, and further wherein the voltage regulator is adapted to generate the first and second bias voltages based, at least in part, on the first and second programmable reference voltages, respectively.

8. The apparatus of claim 1, further comprising a voltage regulator adapted to generate the first and second bias voltages, wherein the voltage regulator comprises a voltage-controlled switch adapted to short together the first and second bias voltages in response to an assertion of a regulator short control signal.

9. An apparatus, comprising:
  means for pulling an output signal to a logically low voltage level comprising first and second means for switching coupled in series between an output signal terminal and a ground voltage connection, the first means for switching to receive a first bias voltage and the second means for switching to receive a first level-shifted data signal having a voltage level based at least in part on the first bias voltage.

10. The apparatus of claim 9, further comprising means for pulling the output signal to a logically high voltage level comprising third and fourth means for switching coupled in series between the output signal terminal and a supply voltage connection, the third means for switching to receive a second bias voltage and the fourth means for switching to receive a second level-switched data signal having a voltage level based at least in part on the second bias voltage.

11. The apparatus of claim 10, further comprising first means for level shifting to receive a first data signal from a logic unit and to receive the first bias voltage, the first means for level shifting further to transmit the first level-shifted data signal to the second means for switching.

12. The apparatus of claim 11, further comprising second means for level shifting to receive a second data signal from the logic unit and to receive the second bias voltage, the second means for level shifting further to transmit the second level-shifted data signal to the fourth means for switching.

13. The apparatus of claim 9, further comprising means for generating the first bias voltage and the second bias voltage comprises comprising means for generating one or more reference voltages, and further wherein the means for generating the first and second bias voltages is adapted to generate the first and second bias voltages based at least in part on the one or more reference voltages generated by the means for generating one or more reference voltages.

14. The apparatus of claim 13, wherein the means for generating one or more reference voltages is programmable.

15. A method, comprising:
  receiving a first bias voltage at a gate of a first transistor of a pull-down path of a buffer circuit, the pull-down path comprising the first transistor and a second transistor coupled in series between a ground voltage connection and an output signal terminal; and
  receiving a first level-shifted data signal at a gate of the second transistor, the first level-shifted data signal having a voltage level based at least in part on the first bias voltage.

16. The method of claim 15, further comprising:
  receiving a second bias voltage at a gate of the third transistor of a pull-up path of the buffer circuit, the pull-up path comprising the third transistor and a fourth transistor coupled in series between the output signal terminal and a supply voltage connection; and
  receiving a second level-shifted data signal at a gate of the fourth transistor, the second level-shifted data signal having a voltage based at least in part on the second bias voltage.

17. The method of claim 16, further comprising:
  level shifting a first data signal from a logic unit to generate the first level-shifted data signal, based, at least in part, on the first bias voltage; and
  transmitting the first level-shifted data signal to the second transistor.

18. The method of claim 17, further comprising:
  level shifting a second data signal from the logic unit to generate the second level-shifted data signal based at least in part on the second bias voltage; and
  transmitting the second level-shifted data signal to the fourth transistor.

19. The method of claim 15, further comprising generating the first and second bias voltages based at least in part on one or more reference voltages generated by a reference voltage generator.

20. The method of claim 19, wherein the reference voltage generator is programmable.

21. The apparatus of claim 2, wherein said first and second transistors comprise NMOS thin-oxide transistors and wherein the third and fourth transistors comprise PMOS thin-oxide transistors.

22. The method of claim 16, wherein said first and second transistors comprise NMOS thin-oxide transistors and wherein the third and fourth transistors comprise PMOS thin-oxide transistors.

* * * * *